(12) United States Patent
Nakamura

(10) Patent No.: US 11,387,283 B2
(45) Date of Patent: Jul. 12, 2022

(54) DISPLAY DEVICE FOR REDUCING DRIVING LOAD OF DATA LINES

(71) Applicant: SHARP KABUSHIKI KAISHA, Sakai (JP)

(72) Inventor: Kohzoh Nakamura, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 17/279,530

(22) PCT Filed: Sep. 28, 2018

(86) PCT No.: PCT/JP2018/036506
§ 371 (c)(1),
(2) Date: Mar. 24, 2021

(87) PCT Pub. No.: WO2020/065992
PCT Pub. Date: Apr. 2, 2020

(65) Prior Publication Data
US 2021/0399064 A1    Dec. 23, 2021

(51) Int. Cl.
*G09G 3/3233* (2016.01)
*H01L 27/32* (2006.01)

(52) U.S. Cl.
CPC ....... *H01L 27/3218* (2013.01); *G09G 3/3233* (2013.01); *H01L 27/3216* (2013.01); *H01L 27/3246* (2013.01); *G09G 2300/0426* (2013.01); *G09G 2300/0443* (2013.01); *G09G 2300/0809* (2013.01); *H01L 27/3276* (2013.01)

(58) Field of Classification Search
CPC ............. H01L 27/3218; H01L 27/3216; H01L 27/3246; H01L 27/3276; G09G 3/3233; G09G 2300/0426; G09G 2300/0443; G09G 2300/0809
See application file for complete search history.

(56) References Cited

U.S. PATENT DOCUMENTS 10,804,340 B2 * 10/2020 Lee ..................... H01L 27/3246
10,953,191 B2 *  3/2021 Mok ..................... A61M 21/02
2015/0015466 A1   1/2015 Feng
(Continued)

FOREIGN PATENT DOCUMENTS

JP    2010-003880 A    1/2010
JP    2015-018242 A    1/2015
JP    2016-001294 A    1/2016

*Primary Examiner* — Kwang-Su Yang
(74) *Attorney, Agent, or Firm* — ScienBiziP, P.C.

(57) ABSTRACT

A display device includes a plurality of subpixels. The plurality of subpixels include a first subpixel including a first light-emitting layer, and a first subpixel circuit, a second subpixel including a second light-emitting layer, and a second subpixel circuit, a third sub subpixel including a third light-emitting layer, and a third subpixel circuit, a fourth subpixel including a fourth light-emitting layer, and a fourth subpixel circuit, and a fifth subpixel including a fifth light-emitting layer, and a fifth subpxiel circuit. A plurality of scanning lines include a first scanning line connected to the fifth subpixel circuit and a second scanning line adjacent to the first scanning line and connected to the first subpixel circuit. A plurality of data lines include a first data line connected to the first subpixel circuit and the fifth subpixel circuit.

17 Claims, 9 Drawing Sheets

(56) References Cited

U.S. PATENT DOCUMENTS

| | | |
|---|---|---|
| 2018/0174511 A1 | 6/2018 | Kim et al. |
| 2019/0043418 A1* | 2/2019 | Rieutort-Louis ... H01L 27/3276 |
| 2019/0212780 A1* | 7/2019 | Choi .................... G09G 3/3266 |

* cited by examiner

DISPLAY DEVICE FOR REDUCING DRIVING LOAD OF DATA LINES

TECHNICAL FIELD

The present invention disclosure relates to a display device.

BACKGROUND ART

PTL 1 discloses an organic EL display in which red, blue, and green subpixels are delta-arranged.

CITATION LIST

Patent Literature

PTL 1: JP 2016-1294 A (published on Jan. 7, 2016)

SUMMARY

Technical Problem

In a case where subpixels are delta-arranged as in the configuration of PTL 1 and a data line is shared by a certain column of subpixels, adjacent subpixels of different colors are connected to the same data line, and thus a driving load of the data line increases.

Solution to Problem

A display device according to an aspect of the disclosure is a display device including a plurality of subpixels each formed to have a light-emitting layer that is island-shaped, in which each of the subpixels has a first electrode, the light-emitting layer, a second electrode, and a corresponding one of a plurality of subpixel circuits provided at intersection points of a plurality of data lines and a plurality of scanning lines, the plurality of subpixels include a first subpixel including a first light-emitting layer, which is island-shaped, and a first subpixel circuit corresponding to the first light-emitting layer, a second subpixel including a second light-emitting layer, which is island-shaped, and a second subpixel circuit corresponding to the second light-emitting layer, a third subpixel including a third light-emitting layer, which is island-shaped, and a third subpixel circuit corresponding to the third light-emitting layer, a fourth subpixel including a fourth light-emitting layer, which is island-shaped, and a fourth subpixel circuit corresponding to the fourth light-emitting layer, and a fifth subpixel including a fifth light-emitting layer, which is island-shaped, and a fifth subpixel circuit corresponding to the fifth light-emitting layer, the first light-emitting layer and the second light-emitting layer are adjacent to each other in a column direction, the fourth light-emitting layer and the fifth light-emitting layer are adjacent to each other in the column direction, the first light-emitting layer and the fourth light-emitting layer are adjacent to each other in a row direction, the second light-emitting layer and the fifth light-emitting layer are adjacent to each other in the row direction, and the third light-emitting layer is adjacent to the first light-emitting layer, the second light-emitting layer, the fourth light-emitting layer, and the fifth light-emitting layer in a diagonal direction, the plurality of scanning lines include a first scanning line connected to the fifth subpixel circuit and a second scanning line adjacent to the first scanning line and connected to the first subpixel circuit, and the plurality of data lines include a first data line connected to the first subpixel circuit and the fifth subpixel circuit.

Advantageous Effects of Disclosure

According to an aspect of the disclosure, even when subpixels are delta-arranged, it is possible to reduce a driving load of a first data line and reduce display failures.

DESCRIPTION OF EMBODIMENTS

Figure 1:
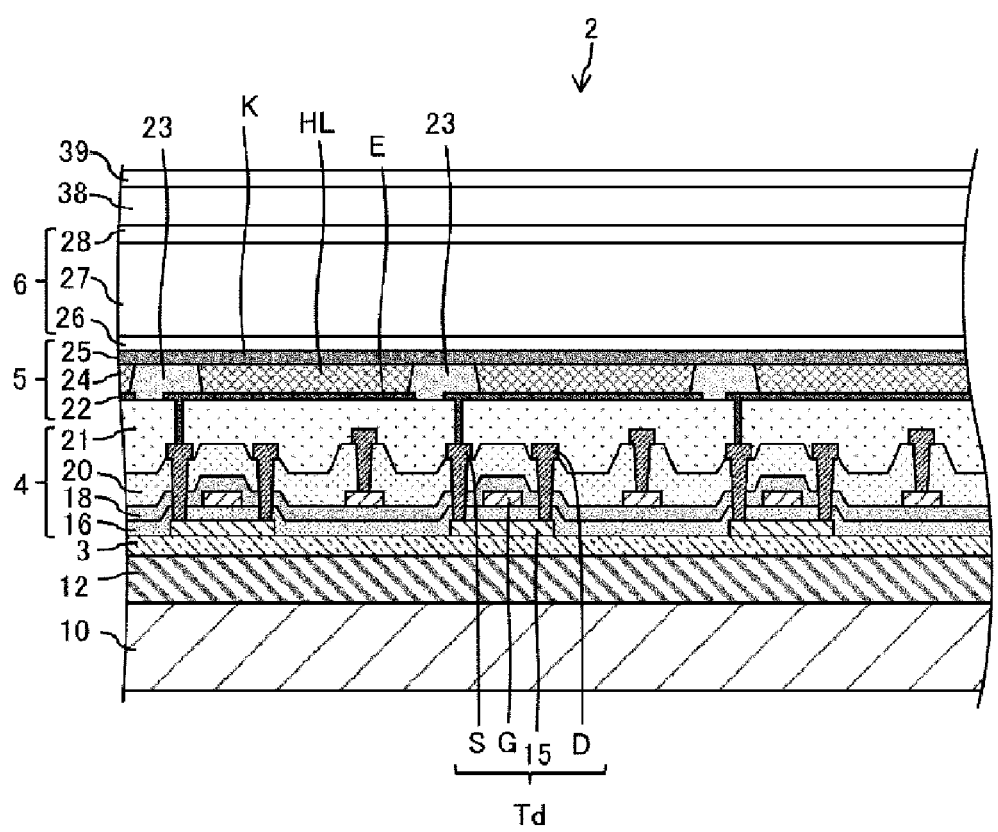
FIG. 1 is a cross-sectional view illustrating a configuration example of a display device.

FIG. 1 is a cross-sectional view illustrating a configuration example of a display device. A display device 2 in FIG. 1 is of a top-emitting type that emits light upward, and includes a base material 10, a resin layer 12, a barrier layer 3 (undercoat layer), a TFT layer 4, a light-emitting element layer 5, a sealing layer 6, an adhesive layer 38, and a function film 39 in this order from a lower side.

An example of the material of the base material 10 is polyethylene terephthalate (PET). Examples of the material of the resin layer 12 include polyimide, epoxy, polyamide, and the like.

The barrier layer 3 is a layer for preventing moisture and impurities from reaching the TFT layer 4 and the light-emitting element layer 5 during usage of the display device. The barrier layer 3 may be constituted by, for example, a silicon oxide film, a silicon nitride film, or a silicon oxynitride film which are formed by CVD, or a layered film thereof.

The TFT layer 4 includes a semiconductor film 15, an inorganic insulating film 16, a gate electrode G, an inorganic insulating film 18, a capacitance wiring C, an inorganic insulating film 20, a source electrode S and a drain electrode D, and a flattening film 21 which are layered in that order from the bottom.

A thin film transistor (light emission control transistor Td) is configured to include the semiconductor film 15, the inorganic insulating film 16 (gate insulating film), and the gate electrode G. The source electrode S is connected to a source region of the semiconductor film 15, and the drain electrode D is connected to a drain region of the semiconductor film 15.

The semiconductor film 15 is constituted by, for example, low-temperature polysilicon (LTPS) or an oxide semiconductor. Note that, although a TFT including the semiconductor film 15 as a channel is illustrated as having a top gate structure in FIG. 2, the TFT may have a bottom gate structure (for example, a case where the channel of the TFT is an oxide semiconductor).

Each of the inorganic insulating films 16, 18, and 20 can be constituted by, for example, a silicon oxide (SiOx) film or a silicon nitride (SiNx) film, which are formed by a CVD method, or a layered film thereof.

The flattening film (interlayer insulating film) 21 can be constituted by a coatable photosensitive organic material such as a polyimide or an acrylic.

The gate electrode G, the source electrode S, and the drain electrode D contain at least one of, for example, aluminum (Al), tungsten (W), molybdenum (Mo), tantalum (Ta), chromium (Cr), titanium (Ti), and copper (Cu). In addition, the gate electrode G, the source electrode S, and the drain electrode D are constituted by a single-layer film or a layered film of a metal.

The light-emitting element layer 5 (for example, an organic light emitting diode layer) includes a lower electrode layer 22 formed on the flattening film 21, a cover film 23 in an upper layer overlying the tower electrode layer 22, a light-emitting layer HL in an upper layer overlying the cover film 23, and an upper electrode layer 25 in an upper layer overlying the light-emitting layer HL. Further, in the light-emitting element layer 5, a light emitting element (for example, an organic light emitting diode: OLED) is configured to include an anode (anode electrode) E (first electrode) of the lower electrode layer 22, the light-emitting layer HL, and a cathode (cathode electrode) K (second electrode) of the upper electrode layer 25. The cover film 23 is a coatable photosensitive organic material such as a polyimide, an epoxy, or an acrylic, and is patterned to cover an edge of the anode E.

The light-emitting layer HL is formed to overlap an opening of the cover film 23 by vapor deposition or an ink-jet method, and an overlapping region of the opening of the cover film 23 (exposed face of the anode E) and the light-emitting layer HL is a light-emitting region of a subpixel. In other words, the area of the opening of the cover film 23 that exposes the anode E in a certain subpixel is a light-emitting region of the subpixel. In the case where the light-emitting element layer 5 is an organic light-emitting diode (OLED) layer, for example, a hole injecting layer, a hole transport layer, the light-emitting layer HL, an electron transport layer, and an electron injecting layer are layered on the exposed face of the anode E, but only the light-emitting layer HL is illustrated here.

The anode E is light-reflective and is constituted by layering, for example, indium tin oxide (ITO) and an alloy containing Ag. The cathode K can be constituted by a transparent conductive material such as a MgAg alloy (a very thin film), indium tin oxide (ITO), or indium zinc oxide (IZO).

In the case where the light-emitting element layer 5 is an OLED layer, holes and electrons are recombined inside the light-emitting layer HL by a drive current between the anode E and the cathode K, and thus light is emitted as a result of excitons, which are generated by the recombination, falling into a ground state. Since the cathode K is transparent and the anode E is light-reflective, light emitted from the light-emitting layer HL travels upwards and results in top emission.

The light-emitting element layer 5 is not only limited to constituting the OLED element, but may also constitute an inorganic light-emitting diode or a quantum dot light-emitting diode.

The sealing layer 6 is transparent, and includes an inorganic sealing film 26, which covers the upper electrode layer 25, the organic sealing film 27 formed in an upper layer overlying the inorganic sealing film 26, and an inorganic sealing film 28, which covers the organic sealing film 27. Each of the inorganic sealing films 26 and 28 can be constituted by, for example, a silicon oxide film, a silicon nitride film, or a silicon oxynitride film, which are formed by CVD using a mask, or a layered film thereof. The organic sealing film 27 is a transparent organic film thicker than the inorganic sealing films 26 and 28 and can be formed of a coatable organic material such as an acrylic. For example, ink containing such an organic material is applied to the inorganic sealing film 26 by an ink-jet method, and is then cured by UV irradiation. The sealing layer 6 covers the light-emitting element layer 5 and prevents foreign matter, such as water and oxygen, from infiltrating into the light-emitting element layer 5.

The function film 39 has, for example, an optical compensation function, a touch sensor function, a protection function, or the like.

First Embodiment

Hereinafter, for ease of description, a vertical direction in the drawings is referred to as a column direction, a horizontal direction in the drawings is referred to as a row direction, and a diagonal direction is based on the row direction and the column direction. Note that, for example, the row direction may have a parallel relationship, an orthogonal relationship, or a diagonal relationship with one edge (one side) of the display device. Further, a subpixel is the smallest display component independently driven. A pixel is a subpixel group corresponding to one set of input signals (R, signal, G signal, and B signal).

Figure 2:
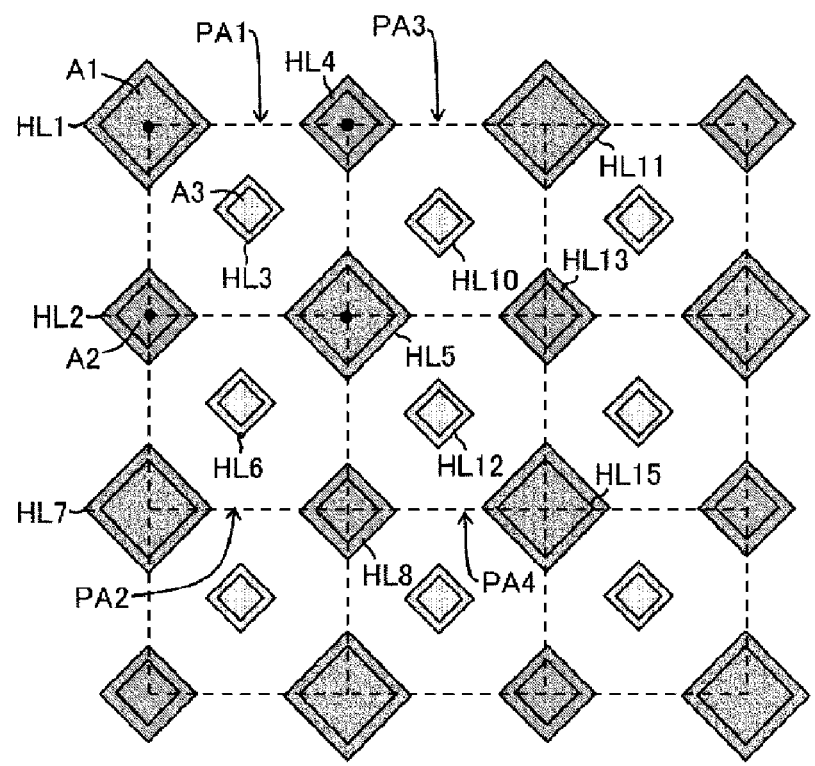
FIG. 2 is a plan view illustrating an arrangement of light-emitting layers and light-emitting regions according to a first embodiment.

FIG. 2 is a plan view illustrating an arrangement of light-emitting layers and light-emitting regions according to the first embodiment. In the display device according to the first embodiment, a light-emitting layer HL1 (a first light-emitting layer) of blue light emission, a light-emitting layer HL2 of red light emission (a second light-emitting layer), and a light-emitting layer HL7 of blue light emission are arranged in that order in the column direction. Furthermore, a light-emitting layer HL4 (a fourth light-emitting layer) of red light emission, a light-emitting layer HL5 (a fifth light-emitting layer) of blue light emission, and a light-emitting layer HL8 of red light emission are arranged in that order in the column direction. Furthermore, a light-emitting layer HL11 of blue light emission, a light-emitting layer HL13 of red light emission, and a light-emitting layer HL15 of blue light emission are arranged in that order in the column direction.

On the other hand, the light-emitting layer HL1, the light-emitting layer HL4, and the light-emitting layer HL11 are arranged in that order in the row direction. In addition, the light-emitting layer HL2, the light-emitting layer HL5, and the light-emitting layer HL13 are arranged in that order in the row direction. Furthermore, the light-emitting layer HL7, the light-emitting layer HL8, and the light-emitting layer HL15 are arranged in that order in the row direction.

A light-emitting layer HL3 of green light emission (a third light-emitting layer) is adjacent to each of the light-emitting layer HL1, the light-emitting layer HL2, the light-emitting layer HL4, and the light-emitting layer HL5 in the diagonal direction. The light-emitting layer HL6 of green light emission is adjacent to each of the light-emitting layer HL2, the light-emitting layer HL7, the light-emitting layer HL5, and the light-emitting layer HL8 in the diagonal direction. A light-emitting layer HL10 of green light emission is adjacent to each of the light-emitting layer HL4, the light-emitting layer HL5, the light-emitting layer HL11, and the light-emitting layer HL13 in the diagonal direction. A light-emitting layer HL12 of green light emission is adjacent to each of the light-emitting layer HL5, the light-emitting layer HL8, the light-emitting layer HL13, and the light-emitting layer HL15 in the diagonal direction.

When seen in a plan view, square pixel areas are arranged in a matrix, and the centers of the light-emitting layers HL1 (blue), HL2 (red), HL4 (red), and HL5 (blue) are disposed at four vertices of a pixel area PA1, and the center of the light-emitting layer HL3 (green) matches the center of the pixel area PA1. The centers of the light-emitting layers HL2 (red), HL7 (blue), HL5 (blue), and HL8 (red) are disposed at four vertices of a pixel area PA2, and the center of the light-emitting layer HL6 (green) matches the center of the pixel area PA2. The centers of the light-emitting layers HL4 (red), HL5 (blue), HL11 (blue), and HL13 (red) are disposed at four vertices of a pixel area PA3, and the center of the light-emitting layer HL10 (green) matches the center of the pixel area PA3. The centers of the light-emitting layers HL5 (blue), HL8 (red), HL13 (red), and HL15 (blue) are disposed at four vertices of a pixel area PA4, and the center of the light-emitting layer HL12 (green) matches the center of the pixel area PA4.

Each of the light-emitting layers has an island shape overlapping one anode, and a square shape (rhombic shape) having two diagonal lines in a row direction and two diagonal lines in a column direction when seen in a plan view. Note that the light-emitting layers of red light emission (HL2, HL4, and the like) have sizes larger than those of the light-emitting layers of green light emission (HL3, HL6, and the like). Similarly, the light-emitting layers of blue light emission (HL1, HL5, HL7, and the like) have sizes larger than those of the light-emitting layers of red light emission (HL2, HL4, and the like) and the light-emitting layers of green light emission (HL3, HL6, and the like).

Figure 3:
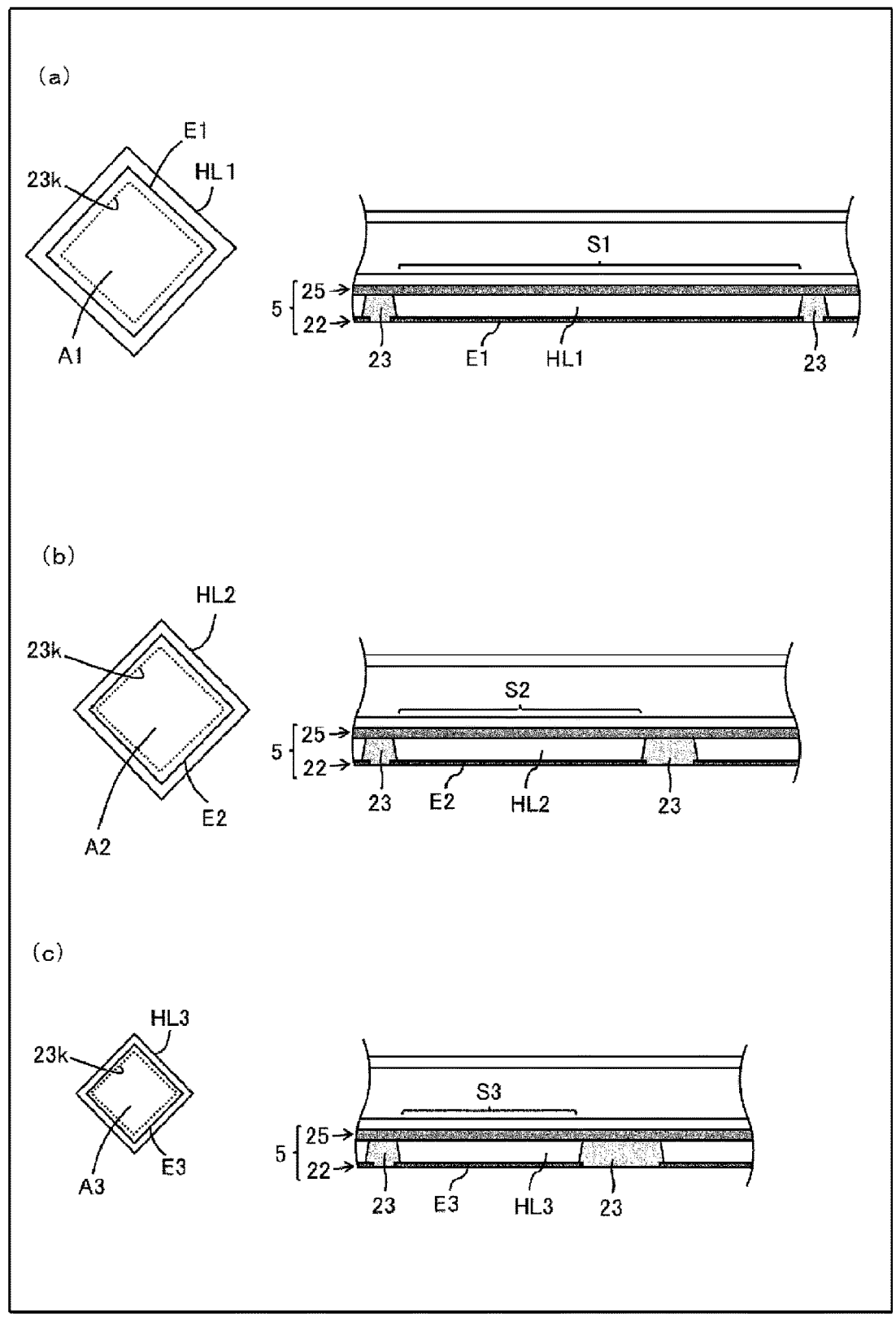
FIG. 3 illustrates plan views and cross-sectional views of subpixels; (a) is a plan view and a cross-sectional view illustrating a blue subpixel, (b) is a plan view and a cross-sectional view illustrating a red subpixel, and (c) is a plan view and a cross-sectional view illustrating a green subpixel.

(a) of FIG. 3 is a plan view and a cross-sectional view illustrating a subpixel S1 (first subpixel), (b) of FIG. 3 is a plan view and a cross-sectional view illustrating a subpixel S2 (second subpixel), and (c) of FIG. 3 is a plan view and a cross-sectional view illustrating a subpixel S3 (third subpixel).

The light-emitting layer HL1 of blue light emission overlaps one anode E1. When seen in a plan view, the anode E1 has a square shape (rhombic shape) having two diagonal lines in the row direction and two diagonal lines in the column direction, and is disposed within an edge of the light-emitting layer HL1. The edge of the anode E1 is covered with the cover film 23, and a region overlapping an exposed portion of the anode E1 (a downward portion of an opening 23k of the cover film) in the light-emitting layer HL1 is a light-emitting region A1. A blue subpixel S1 is formed to include the anode E1 and the light-emitting region A1 of the light-emitting layer HL1. Note that the blue subpixel S5 (fifth subpixel) may also have the same configuration as the subpixel S1.

The light-emitting layer HL2 of red light emission overlaps one anode E2. When seen in a plan view, the anode E2 has a square shape (rhombic shape) having two diagonal lines in the row direction and two diagonal lines in the column direction, and is arranged within an edge of the light-emitting layer HL2. The edge of the anode E2 is covered with the cover film 23, and a region overlapping an exposed portion of the anode E2 (a downward portion of the opening 23k of the cover film) in the light-emitting layer HL2 is a light-emitting region A2. A red subpixel S2 is formed to include the anode E2 and the light-emitting region A2 of the light-emitting layer HL2. Note that the red subpixel S4 (fourth subpixel) may also have the same configuration as the subpixel S2.

The light-emitting layer HL3 of green light emission overlaps one anode E3. When seen in a plan view, the anode E3 has a square shape (rhombic shape) having two diagonal lines in the row direction and two diagonal lines in the column direction, and is disposed within an edge of the light-emitting layer HL3. The edge of the anode E3 is covered with the cover film 23, and a region overlapping an exposed portion of the anode E3 (a downward portion of the opening 23k of the cover film) in the light-emitting layer HL3 is a light-emitting region A3. A green subpixel S3 is formed to include the anode E3 and the light-emitting region A3 of the light-emitting layer HL3.

Each of the light-emitting regions A1, A2, and A3 has a square shape (rhombic shape) having two diagonal lines in the row direction and two diagonal lines in the column direction, the light-emitting region A2 (red) is larger than the light-emitting region A3 (green), and the light-emitting region A1 (blue) is larger than the light-emitting regions A2 and A3.

Figure 4:
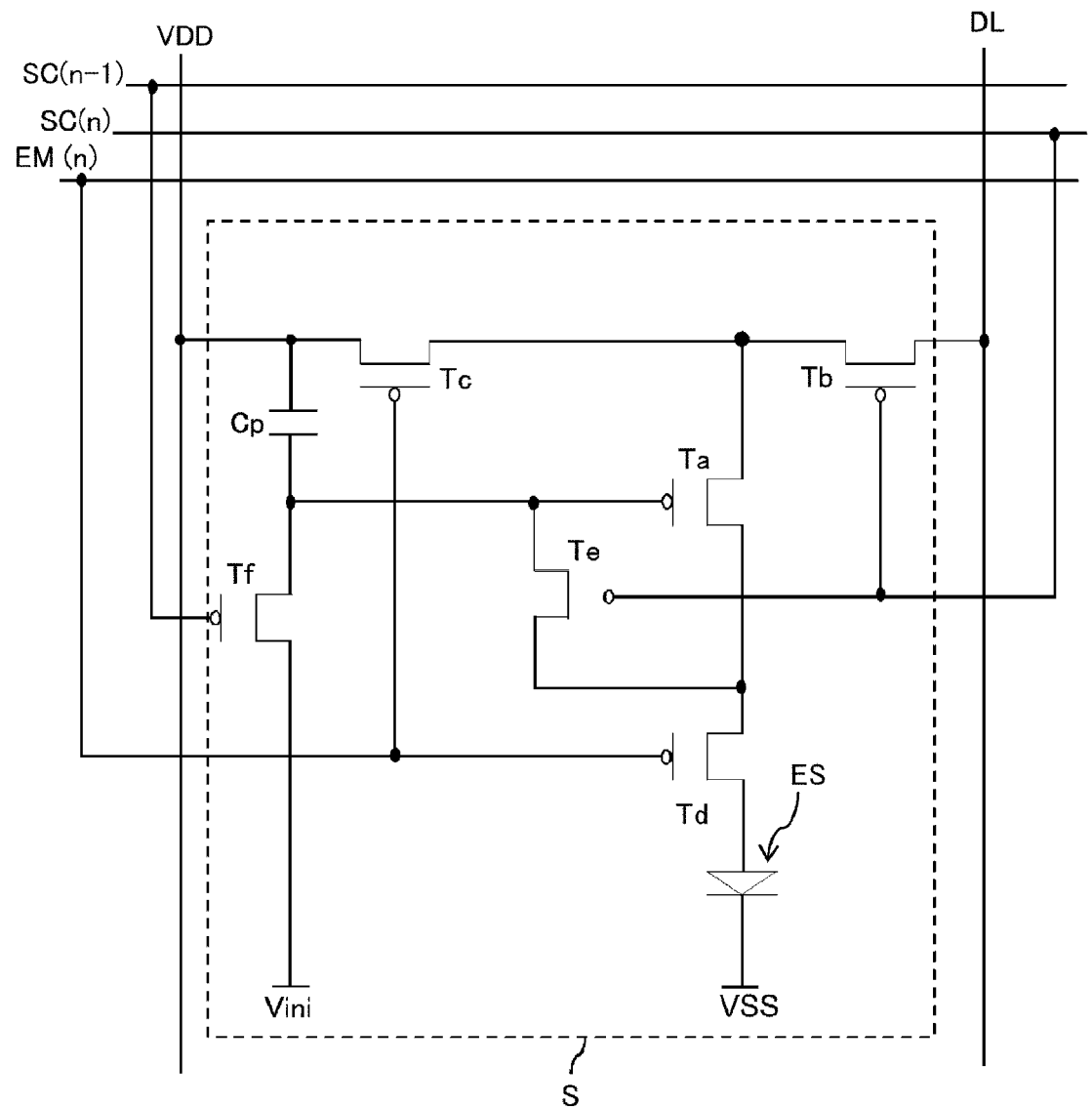
FIG. 4 is a circuit diagram illustrating a configuration example of a subpixel.

FIG. 4 is a circuit diagram illustrating a configuration example of a subpixel. The TFT layer 4 is provided with a plurality of data lines DL extending in the column direction, a plurality of scanning lines SC(n) and a plurality of light emission control lines EM(n) extending in the row direction, and subpixels S are connected to the data lines DL and the scanning lines SC(n). Note that a high-level power source VDD and a low-level power source VSS for driving the organic EL element, and an initialization voltage Vini are supplied to the subpixels S. During a period in which the scanning line SC(n) is active, a potential signal corresponding to display gray scale data is supplied from the data line DL to each of the subpixels connected thereto.

Each of the subpixels S includes a subpixel circuit formed in the TFT layer 4 in FIG. 1, and a light emitting element ES (for example, an organic light emitting diode) formed in the light-emitting element layer 5 in FIG. 1 and including an anode E and a light-emitting layer HL. The subpixel circuit includes a drive transistor Ta, a switch transistor Tb, a power supply control transistor Tc, a light emission control transistor Td, a threshold voltage compensation transistor Te, an initialization transistor Tf, and a capacitor Cp. In other words, the subpixels S1, S2, S3, S4, and S5 respectively include light-emitting layers HL1, HL2, HL3, HL4, and HL5, and first, second, third, fourth, and fifth subpixel circuits corresponding to the respective light-emitting layers.

Regarding the drive transistor Ta, a gate electrode is connected to a source electrode of the threshold voltage compensation transistor Te, a drain electrode of the initialization transistor Tf, and one electrode of the capacitor Cp.

In addition, a drain electrode is connected to a source electrode of the switch transistor Tb and a source electrode of the power supply control transistor Tc, and a source electrode is connected to a drain electrode of the light emission control transistor Td and a drain electrode of the threshold voltage compensation transistor Te.

Regarding the switch transistor Tb, a gate electrode is connected to the scanning line SC(n) of the n-th row, a drain electrode is connected to the data line DL, and a source electrode is connected to the drain electrode of the drive transistor Ta and the source electrode of the power supply control transistor Tc. Regarding the power supply control transistor Tc, a gate electrode is connected to the light emission control line EM(n) of the n-th row. In addition, a drain electrode is connected to a supply line of the high-level power source VDD and the other electrode of the capacitor Cp, and a source electrode is connected to the drain electrode of the drive transistor Ta and the source electrode of the switch transistor Tb.

The anode of the light-emitting element ES is connected to the drain electrode of the light emission control transistor Td, and the cathode of the light-emitting element ES is connected to a supply line of the low-level power source VSS.

Figure 5:
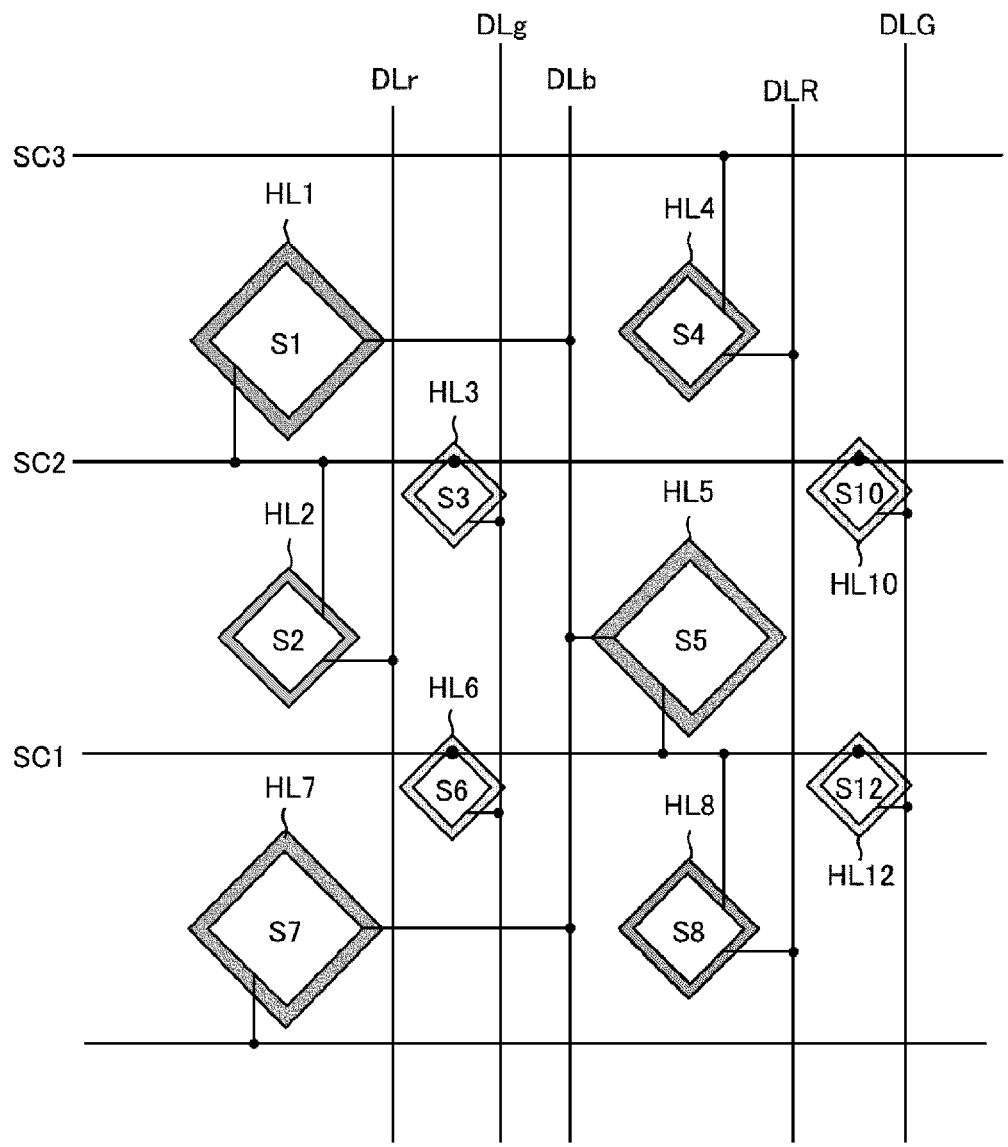
FIG. 5 is a schematic view illustrating a connection relationship between subpixels, scanning lines, and data lines in the first embodiment.

FIG. 5 is a schematic view illustrating a connection relationship between subpixels, scanning lines, and data lines in the first embodiment. Similar to the blue subpixel S1 illustrated in FIG. 3, the blue subpixels S5 and S7 have light-emitting layers HL5 and HL7, respectively. In addition, similar to the red subpixel S2, the red subpixels S4 and S8 have light-emitting layers HL4 and HL8, respectively. Furthermore, similar to the green subpixel S3, the green subpixels S6, S10, and S12 have light-emitting layers HL6, HL10, and HL12, respectively.

The subpixels S1, S5, and S7 are connected to a blue data line DLb (first data line), the subpixel S2 is connected to a red data line DLr (second data line), and the subpixels S3 and S6 are connected to a green data line DLg (third data line). In addition, the subpixels S4 and S8 are connected to a red data line DLR, and the subpixels S10 and S12 are connected to a green data line DLG. Further, the subpixels S1, S2, S3, and S10 are connected to a second scanning line SC2, and the subpixels S5, S6, and S12 are connected to a first scanning line SC1 adjacent to the second scanning line SC2. Further, the subpixels S5, S6, and S12 are connected to the first scanning line SC1, and the subpixels S1, S2, S3, and S10 are connected to the second scanning line SC2 adjacent to the first scanning line SC1. In addition, the subpixel S4 is connected to the second scanning line SC2 and a third scanning line SC3 adjacent thereto on a side opposite to the first scanning line SC1, Note that an SPR ratio (the number of subpixels per pixel/3) is ⅔.

According to the first embodiment, in a case where the arrangement of subpixels is a delta arrangement, the subpixels S1 and S5, which are subpixels of the same color and which are adjacent to each other, are connected to the same data line.

Generally, in subpixels that are close to each other and that have the same color, the same value of data tends to be input in scanning of a scanning line. Thus, when the subpixels that are close to each other and have the same color are connected to the same data line, a signal applied to the data line is less likely to change for each scanning of a scanning line. For this reason, it is possible to reduce changes in a signal applied to a data line for each scanning of a scanning line. Thus, it is possible to reduce an effective load of a signal applied to a data line, to reduce the lack of charging in the capacitor Cp of each of the subpixels connected to the data line, and to improve the quality of display.

According to the first embodiment, it is possible to enlarge light-emitting regions of the light-emitting layers HL1 and HL5 while suppressing vapor deposition defects given an equivalent of two light-emitting layers formed in one pixel area (0.5 light-emitting layers HL1 and HL5, 0.5 light-emitting layers HL2 and HL4, and 1 light-emitting layer HL3). For this reason, it is possible to reduce deterioration of a light-emitting layer in a specific subpixel, such as in the case of the subpixels S1 and S5.

In particular, in the present embodiment, it is possible to enlarge a light-emitting region of a blue light-emitting layer (which is generally more likely to deteriorate than red and green light-emitting layers). For example, in one pixel area PA1, ¼ of the blue light-emitting layer HL1, ¼ of the blue light-emitting layer HL5, ¼ of the red light-emitting layer HL2, ¼ of the red light-emitting layer HL4, and 1/1 (all) of the green light-emitting layer HL3 are formed. However, the blue light-emitting layers HL1 and HL5 have light-emitting regions larger than the light-emitting regions of the red light-emitting layers HL2 and HL4 and the green light-emitting layer HL3, and a luminance per unit area can be decreased (a current density can be decreased), whereby it is possible to suppress deterioration of the blue light-emitting layer.

In addition, light-emitting regions have the same area between subpixels that are adjacent to each other and are connected to the same data line. For this reason, because the load of signal application is made substantially uniform between subpixels connected to the same data line, it is possible to improve the quality of display more efficiently.

Comparative Embodiment

Figure 6:
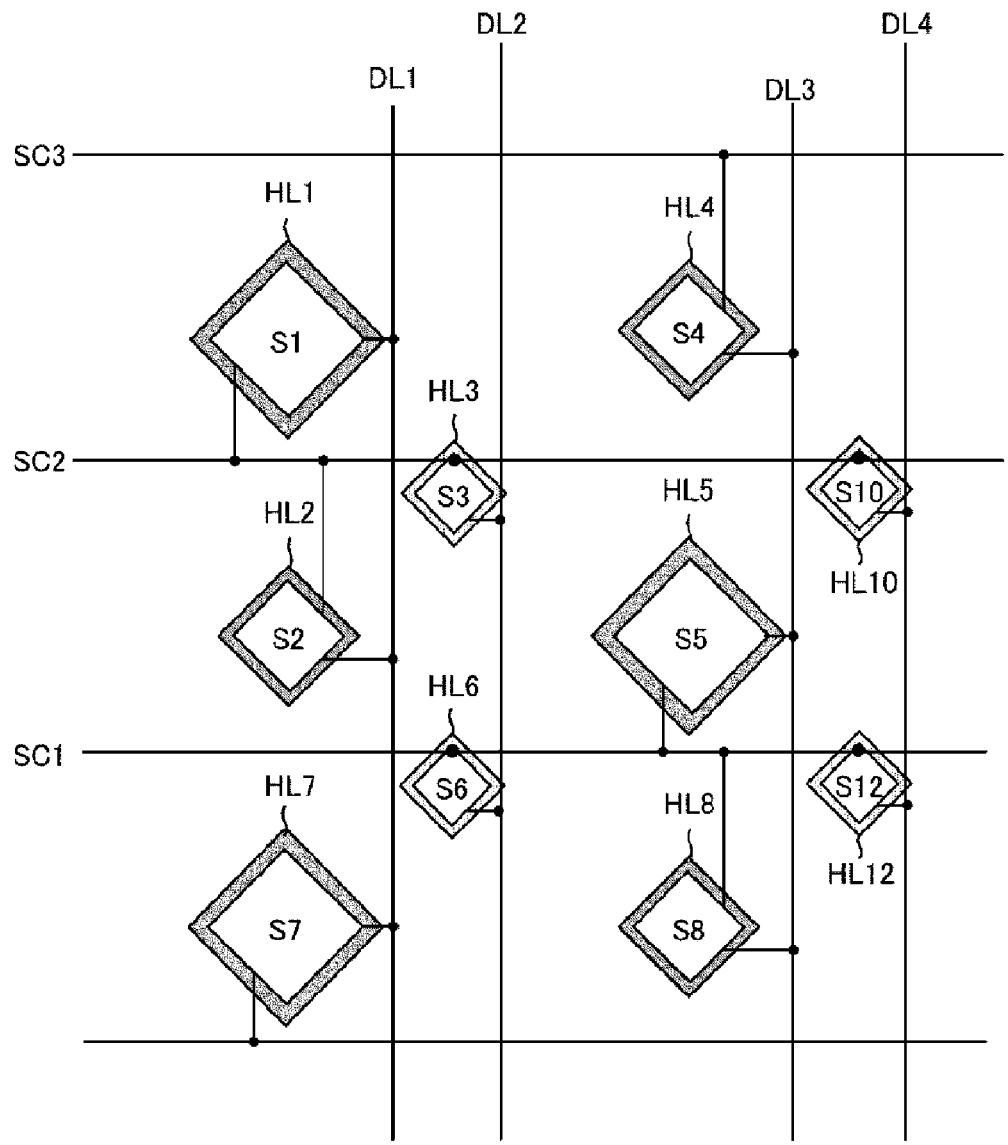
FIG. 6 is a schematic view illustrating a connection relationship between subpixels, scanning lines, and data lines in a comparative example.

FIG. 6 is a schematic view illustrating a connection relationship between subpixels, scanning lines, and data lines according to a comparative embodiment. With the exception of a data line to which respective subpixels are connected being different, a display device in the comparative embodiment and the display device 2 according to the present embodiment may have the same configuration.

In the present comparative embodiment, subpixels S1, S2, and S7 are connected to a data line DL1, subpixels S3 and 56 are connected to a data line DL2, subpixels S4, S5, and S8 are connected to a data line DL3, and subpixels S10 and S12 are connected to a data line DL4.

In the present comparative embodiment, the subpixels S1 and S7, which are blue subpixels, and the subpixel S2, which is a red subpixel, are connected to the same data line DL1. In the present comparative embodiment, the subpixel S5, which is a blue subpixel, and the subpixels S4 and S8, which are red subpixels, are connected to the same data line DL3.

For this reason, in a case where subpixels are delta-arranged, there is a data line to which subpixels that are close to each other and that have different colors are connected. In this case, in general, each time a scanning line to be scanned is changed, a signal to be applied to the data line often changes greatly.

In a case where subpixels that are adjacent to each other and have different colors are connected to the same data line, for example, it may be necessary to write low gradation data in a certain subpixel and then write high gradation data in an adjacent subpixel. In this case, it is necessary to greatly change a signal to be applied from a low gradation data signal to a high gradation data signal during one short scanning of a scan line.

As a result, an effective driving load in a data line for applying the data increases. Thus, the likelihood that charging in the capacitor Cp of a latter subpixel will not be sufficiently performed is increased. Thus, the likelihood that a display failure will occur in the display device according to the comparative embodiment due to insufficient charging in the capacitor Cp of the subpixel, or the like increases.

Second Embodiment

Figure 7:
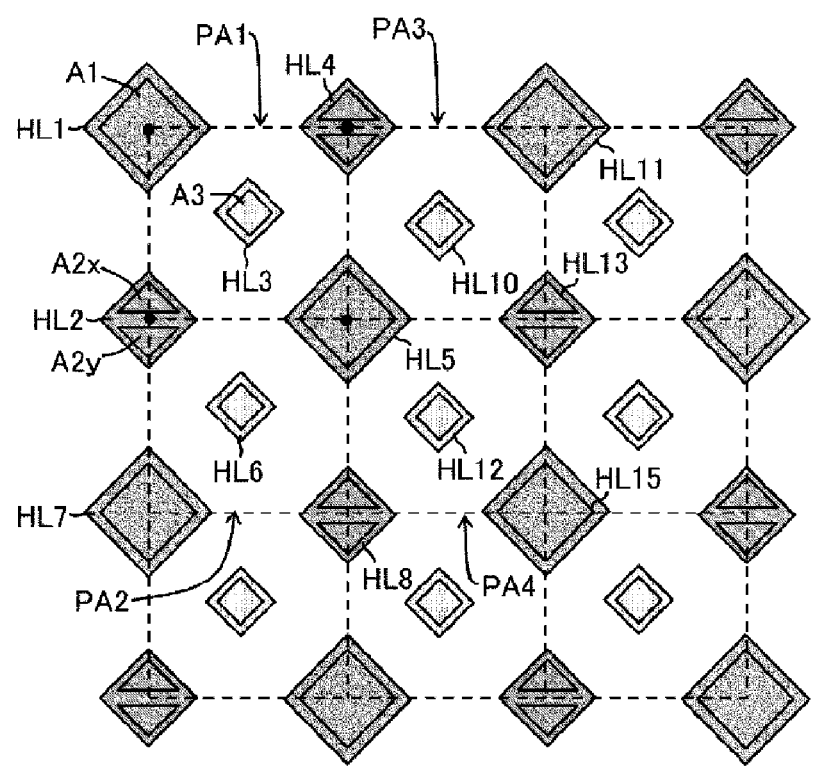
FIG. 7 is a plan view illustrating an arrangement of a light-emitting layer and a light-emitting region according to a second embodiment.

FIG. 7 is a plan view illustrating an arrangement of a light-emitting layer and an anode according to a second embodiment. In a display device according to the second embodiment, each of light-emitting layers of red light emission (HL2, HL4, HL8, and HL13) overlaps two electrically independent anodes, and two independent subpixel circuits individually connected to the two anodes are provided for each red subpixel. Except for this point, the display device according to the present embodiment may have the same configuration as the display device according to the previous embodiment.

Figure 8:
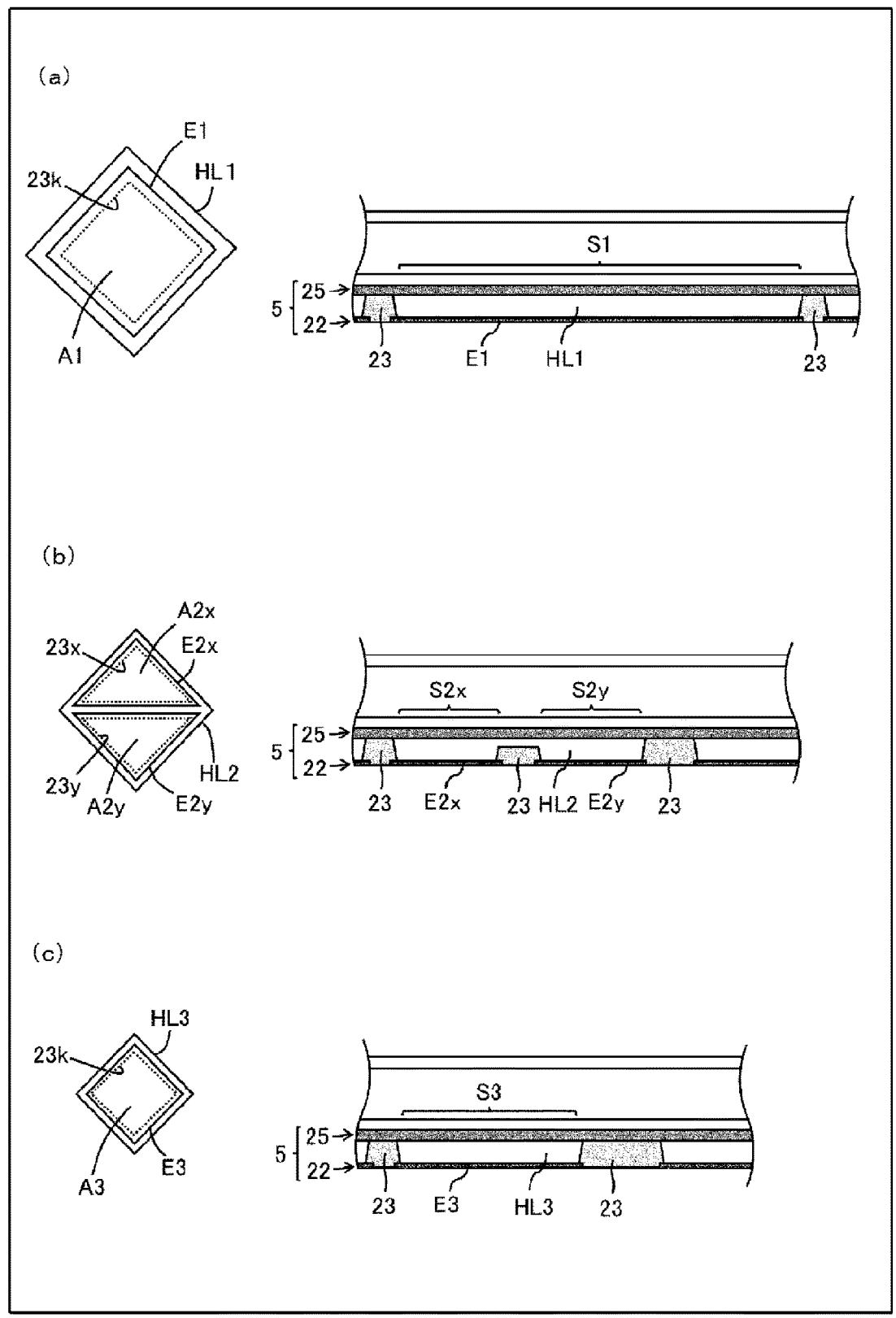
FIG. 8 illustrates plan views and cross-sectional views of subpixels; (a) is a plan view and a cross-sectional view illustrating a blue subpixel, (b) is a plan view and a cross-sectional view illustrating a red subpixel, and (c) is a plan view and a cross-sectional view illustrating a green subpixel.

(a) of FIG. 8 is a plan view and a cross-sectional view illustrating a subpixel S1 (first subpixel), (b) of FIG. 8 is a plan view and a cross-sectional view illustrating a subpixel S2 (second subpixel), and (c) of FIG. 8 is a plan view and a cross-sectional view illustrating a subpixel S3 (third subpixel).

The light-emitting layer HL2 of red light emission overlaps two anodes E2$x$ (21st electrode) and E2$y$ (22nd electrode). When seen in a plan view, the anodes E2$x$ and E1$y$ are both right isosceles triangles, and are disposed line-symmetrically within the edge of the light-emitting layer HL2 so that the bases are adjacent to each other in a column direction.

The light-emitting layer HL2 is formed to cross a cover film 23 covering the respective edges of the two anodes E2$x$ and E2$y$, and overlaps an exposed portion of the anode E2$x$ (a downward portion of an opening 23$x$ of the cover film) and an exposed portion of the anode E2$y$ (a downward portion of an opening 23$y$ of the cover film). That is, the light-emitting layer HL2 includes a light-emitting region A2$x$ overlapping the exposed portion of the anode E2$x$ (the downward portion of the opening 23$x$ of the cover film) and a light-emitting region A2$y$ overlapping the exposed portion of the anode E2$y$ (the downward portion of the opening 23$y$ of the cover film).

The subpixel S2 includes a red subpixel S2$x$ and a red subpixel S2$y$. The red subpixel S2$x$ is formed to include the anode E2$x$ and the light-emitting region A2$x$ of the light-emitting layer HL2, and the red subpixel S2$y$ is formed to include the anode E2$y$ and the light-emitting region A2$y$ of the light-emitting layer HL2.

The second subpixel circuits formed in the subpixel S2 include a 21st subpixel circuit and a 22nd subpixel circuit. The 21st subpixel circuit and the 22nd subpixel circuit are individually formed in the subpixel S2$x$ and the subpixel S2$y$. The subpixels S2$x$ and S2$y$ are driven separately by controlling the 21st subpixel circuit and the 22nd subpixel circuit.

Note that, in the present embodiment, the subpixel S4 may also have the same configuration as the subpixel S2. For example, the light-emitting layer HL4 of red light emission may be formed to overlap two anodes E4$x$ (a 41st electrode) and E4$y$ (a 42nd electrode). The subpixel S4 may include a red subpixel S4$x$ and a red subpixel S4$y$. In addition, the red subpixel S4$x$ may be formed to include the anode E4$x$ and a light-emitting region A4$x$ of the light-emitting layer HL4, and the red subpixel S4$y$ may be formed to include the anode E4$y$ and a light-emitting region A4$y$ of the light-emitting layer HL4.

Furthermore, fourth subpixel circuits formed in the subpixel S4 may include a 41st subpixel circuit and a 42nd subpixel circuit, and the 41st subpixel circuit and the 42nd subpixel circuit may be individually formed in the subpixel S4$x$ and the subpixel S4$y$. In this case, the subpixels S4$x$ and S4$y$ are driven separately by controlling the 41st subpixel circuit and the 42nd subpixel circuit.

Figure 9:
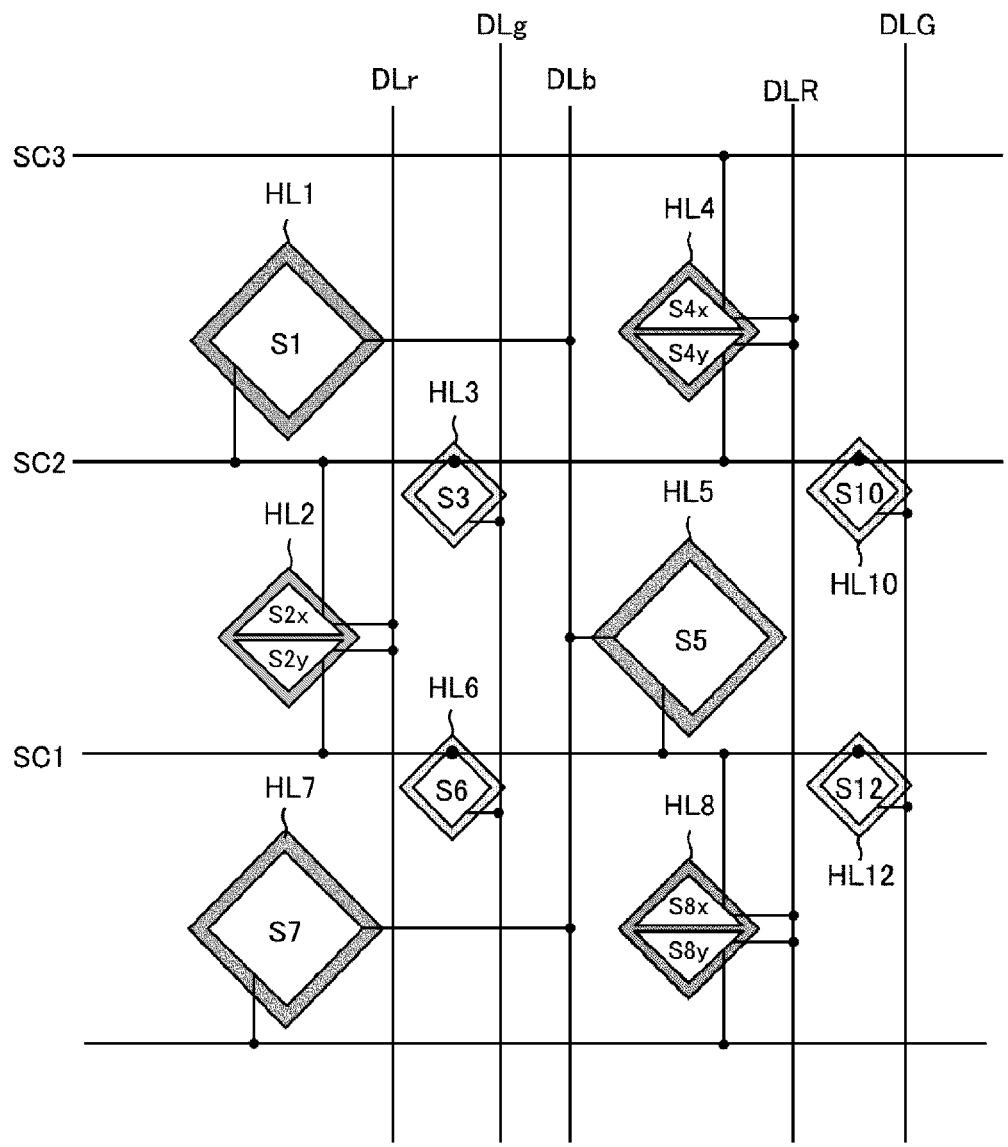
FIG. 9 is a schematic view illustrating a connection relationship between subpixels, scanning lines, and data lines in the second embodiment.

FIG. 9 is a schematic view illustrating a connection relationship between subpixels, scanning lines, and data lines in the second embodiment. The red subpixels S2$x$ and S2$y$ are connected to a red data line DLr, and the red subpixels S4$x$ and S4$y$ are connected to a red data line DLR. In addition, the subpixel S2$y$ is connected to a first scanning line SC1, the subpixels S2$x$ and S4$y$ are connected to a second scanning line SC2, and the subpixel S4$x$ is connected to a third scanning line SC3. An SPR ratio (the number of subpixels per pixel/3) is ⅚.

According to the second embodiment, a configuration in which two subpixels S2$x$ and S2$y$ adjacent to each other share one light-emitting layer HL2 is adopted, and thus it is possible to realize high definition with an SPR ratio of ⅚.

Note that, in the present embodiment, the subpixels S2$x$ and S2$y$ are red subpixels. The degree of discrimination of resolution of a human eye is higher in red than in blue. That is, regarding the discrimination of resolution of two subpixels adjacent to each other, a viewer is more likely to perceive the resolutions when the subpixels are red than when the subpixels are blue. For this reason, with respect to higher definition, it is more advantageous when two adjacent subpixels share the same red light-emitting layer than when two adjacent subpixels share the same blue light-emitting layer.

An electro-optical element (an electro-optical element whose luminance and transmittance are controlled by an electric current) that is provided in the display devices according to the above-described embodiments is not particularly limited. The display devices according to the above-described embodiments may include, for example, an organic light-emitting diode (OLED) as an electro-optical element. Thus, the display devices according to the above-described embodiments may be, for example, an organic electro luminescent (EL) display including an OLED. In addition, the display devices according to the above-described embodiments may be an inorganic EL display including an inorganic light-emitting diode as an electro-optical element. Further, the display devices according to the above-described embodiments may be a quantum dot light-emitting diode (QLED) display including a QLED as an electro-optical element.

Supplement

A display device according to a first aspect is a display device including a plurality of subpixels each formed to have a light-emitting layer that is island-shaped, in which each of the plurality of subpixels has a first electrode, the light-emitting layer, a second electrode, and a corresponding one of a plurality of subpixel circuits provided at intersection points of a plurality of data lines and a plurality of scanning lines, the plurality of subpixels include a first subpixel including a first light-emitting layer, which is island-shaped, and a first subpixel circuit corresponding to the first light-emitting layer, a second subpixel including a second light-emitting layer, which is island-shaped, and a second subpixel circuit corresponding to the second light-emitting layer, a third subpixel including a third light-emitting layer, which is island-shaped, and a third subpixel circuit corresponding to the third light-emitting layer, a fourth subpixel including a fourth light-emitting layer, which is island-shaped, and a fourth subpixel circuit corresponding to the fourth light-emitting layer, and a fifth subpixel including a fifth light-emitting layer, which is island-shaped, and a fifth subpixel circuit corresponding to the fifth light-emitting layer, the first light-emitting layer and the second light-emitting layer are adjacent to each other in a column direction, the fourth light-emitting layer and the fifth light-emitting layer are adjacent to each other in the column direction, the first light-emitting layer and the fourth light-emitting layer are adjacent to each other in a row direction, the second light-emitting layer and the fifth light-emitting layer are adjacent to each other in the row direction, and the third light-emitting layer is adjacent to the first light-emitting layer, the second light-emitting layer, the fourth light-emitting layer, and the fifth light-emitting layer in a diagonal direction, the plurality of scanning lines include a first scanning line connected to the fifth subpixel circuit and a second scanning line adjacent to the first scanning line and connected to the first subpixel circuit, and the plurality of data lines include a first data line connected to the first subpixel circuit and the fifth subpixel circuit.

In a second aspect, the second subpixel circuit and the fourth subpixel circuit are connected to different data lines among the plurality of data lines.

In a third aspect, the plurality of data lines further include a second data line connected to the second subpixel circuit and a third data line connected to the third subpixel circuit.

In a fourth aspect, the first data line, the second data line, and the third data line are respectively connected to, among the plurality of subpixel circuits, subpixel circuits corresponding to light-emitting layers of an identical color among the plurality of light-emitting layers.

In a fifth aspect, the first subpixel circuit, the second subpixel circuit, and the third subpixel circuit are connected to the second scanning line.

In a sixth aspect, the plurality of scanning lines further include a third scanning line that is adjacent to the second scanning line on a side opposite to the first scanning line and that is connected to the fourth subpixel circuit.

In a seventh aspect, the fifth subpixel circuit is connected to the first scanning line.

In an eighth aspect, the first electrode in the second subpixel is divided into a 21st electrode and a 22nd electrode, the second subpixel circuit includes a 21st subpixel circuit including the 21st electrode and a 22nd subpixel circuit including the 22nd electrode, the 21st subpixel circuit is connected to the second scanning line, the 22nd subpixel circuit is connected to the first scanning line, and the 21st subpixel circuit and the 22nd subpixel circuit are connected to an identical data line among the plurality of data lines.

In a ninth aspect, the plurality of data lines further include a second data line connected to the 21st subpixel circuit and the 22nd subpixel circuit.

In a tenth aspect, the first electrode in the fourth subpixel is divided into a 41st electrode and a 42nd electrode, the fourth subpixel circuit includes a 41st subpixel circuit including the 41st electrode and a 42nd subpixel circuit including the 42nd electrode, the 41st subpixel circuit and the 42nd subpixel circuit are connected to an identical data line among the plurality of data lines, the 42nd subpixel circuit is connected to the second scanning line, and the plurality of scanning lines further include a third scanning line that is adjacent to the second scanning line on a side opposite to the first scanning line and that is connected to the 41st subpixel circuit.

In an eleventh aspect, the first light-emitting layer emits blue light, the second light-emitting layer emits red light, and the third tight-emitting layer emits green light.

In a twelfth aspect, each of the plurality of subpixels is further provided with a cover film including an opening exposing the first electrode, the first light-emitting layer emits blue light, and an area of the opening exposing the first electrode in the first subpixel is greater than an area of the opening exposing the first electrode in each of the second subpixel, the third subpixel, and the fourth subpixel.

In a thirteenth aspect, the area of the opening exposing the first electrode in the first subpixel is the same as the area of the opening exposing the first electrode in the fifth subpixel.

In a fourteenth aspect, the plurality of data lines include a second data line and a third data line, the areas of the openings exposing corresponding ones of the first electrodes between subpixels of an identical color among the plurality of subpixels, which are adjacent to each other and connected to the second data line, are identical, and the areas of the openings exposing corresponding ones of the first electrodes between subpixels of an identical color among the plurality of subpixels, which are adjacent to each other and connected to the third data line, are identical.

In a fifteenth aspect, the first light-emitting layer and the fifth light-emitting layer have an identical light emission color, and the second light-emitting layer and the fourth light-emitting layer have an identical light emission color.

In a sixteenth aspect, the first electrode is an anode, and the second electrode is a cathode.

In a seventeenth aspect, the first light-emitting layer, the second light-emitting layer, the third light-emitting layer, the fourth light-emitting layer, and the fifth light-emitting layer have a square shape having diagonal lines parallel in the row direction and diagonal lines parallel in the column direction, when seen in a plan view.

In an eighteenth aspect, the display device is an organic EL display.

The disclosure is not limited to the embodiments described above. Embodiments obtained by appropriately combining technical means disclosed in different embodiments also fall within the technical scope of the disclosure. Furthermore, novel technical features can be formed by combining the technical approaches disclosed in the embodiments.

The invention claimed is:
1. A display device comprising:
a plurality of subpixels each formed to have a light-emitting layer that is island-shaped,
wherein
each of the plurality of subpixels has a first electrode, the light-emitting layer, a second electrode, and a corresponding one of a plurality of subpixel circuits provided at intersection points of a plurality of data lines and a plurality of scanning lines,
the plurality of subpixels includes
a first subpixel including a first light-emitting layer, which is island-shaped, and a first subpixel circuit corresponding to the first light-emitting layer,
a second subpixel including a second light-emitting layer, which is island-shaped, and a second subpixel circuit corresponding to the second light-emitting layer, a third subpixel including a third light-emitting layer, which is island-shaped, and a third subpixel circuit corresponding to the third light-emitting layer, a fourth subpixel including a fourth light-emitting layer, which is island-shaped, and a fourth subpixel circuit corresponding to the fourth light-emitting layer, and a fifth subpixel including a fifth light-emitting layer, which is island-shaped, and a fifth subpixel circuit corresponding to the fifth light-emitting layer, the first light-emitting layer and the second light-emitting layer are adjacent to each other in a column direction, the fourth light-emitting layer and the fifth light-emitting layer are adjacent to each other in the column direction, the first light-emitting layer and the fourth light-emitting layer are adjacent to each other in a row direction, the second light-emitting layer and the fifth light-emitting layer are adjacent to each other in the row direction, the third light-emitting layer is adjacent to the first light-emitting layer, the second light-emitting layer, the fourth light-emitting layer, and the fifth light-emitting layer in a diagonal direction, the plurality of scanning lines includes
- a first scanning line connected to the fifth subpixel circuit, the first scanning line not being connected to the second subpixel circuit,
- a second scanning line adjacent to the first scanning line and connected to the first subpixel circuit and the second subpixel circuit, the second scanning line not being connected to the fourth subpixel circuit or the fifth subpixel circuit, and
- a third scanning line adjacent to the second scanning line, different from the first scanning line and the second scanning line, and connected to the fourth subpixel circuit, the third scanning line not being connected to the first subpixel circuit, and the plurality of data lines includes a first data line connected to the first subpixel circuit and the fifth subpixel circuit.

2. The display device according to claim 1,
wherein the second subpixel circuit and the fourth subpixel circuit are connected to different data lines among the plurality of data lines.

3. The display device according to claim 1,
wherein the plurality of data lines further includes a second data line connected to the second subpixel circuit and a third data line connected to the third subpixel circuit.

4. The display device according to claim 3,
wherein the first data line, the second data line, and the third data line are each connected to subpixel circuits, among the plurality of subpixel circuits, corresponding to light-emitting layers of an identical color among the plurality of light-emitting layers.

5. The display device according to claim 1,
wherein the first subpixel circuit, the second subpixel circuit, and the third subpixel circuit are connected to the second scanning line.

6. The display device according to claim 1,
wherein the third scanning line is adjacent to the second scanning line on a side opposite to the first scanning line.

7. The display device according to claim 1,
wherein the first light-emitting layer emits blue light, the second light-emitting layer emits red light, and the third light-emitting layer emits green light.

8. The display device according to claim 1,
wherein the first light-emitting layer and the fifth light-emitting layer have an identical light emission color, and the second light-emitting layer and the fourth light-emitting layer have an identical light emission color.

9. The display device according to claim 1,
wherein the first electrode is an anode, and the second electrode is a cathode.

10. The display device according to claim 1,
wherein the first light-emitting layer, the second light-emitting layer, the third light-emitting layer, the fourth light-emitting layer, and the fifth light-emitting layer have a square shape having diagonal lines parallel in the row direction and diagonal lines parallel in the column direction, when seen in a plan view.

11. The display device according to claim 1,
wherein the display device is an organic electroluminescent (EL) display.

12. A display device, comprising:
a plurality of subpixels each formed to have a light-emitting layer that is island-shaped,
wherein
each of the plurality of subpixels has a first electrode, the light-emitting layer, a second electrode, and a corresponding one of a plurality of subpixel circuits provided at intersection points of a plurality of data lines and a plurality of scanning lines, the plurality of subpixels includes
- a first subpixel including a first light-emitting layer, which is island-shaped, and a first subpixel circuit corresponding to the first light-emitting layer,
- a second subpixel including a second light-emitting layer, which is island-shaped, and a second subpixel circuit corresponding to the second light-emitting layer,
- a third subpixel including a third light-emitting layer, which is island-shaped, and a third subpixel circuit corresponding to the third light-emitting layer,
- a fourth subpixel including a fourth light-emitting layer, which is island-shaped, and a fourth subpixel circuit corresponding to the fourth light-emitting layer, and
- a fifth subpixel including a fifth light-emitting layer, which is island-shaped, and a fifth subpixel circuit corresponding to the fifth light-emitting layer, the first light-emitting layer and the second light-emitting layer are adjacent to each other in a column direction, the fourth light-emitting layer and the fifth light-emitting layer are adjacent to each other in the column direction, the first light-emitting layer and the fourth light-emitting layer are adjacent to each other in a row direction, the second light-emitting layer and the fifth light-emitting layer are adjacent to each other in the row direction, the third light-emitting layer is adjacent to the first light-emitting layer, the second light-emitting layer, the fourth light-emitting layer, and the fifth light-emitting layer in a diagonal direction, the plurality of scanning lines includes a first scanning line connected to the fifth subpixel circuit and a second scanning line adjacent to the first scanning line and connected to the first subpixel circuit, the plurality of data lines includes a first data line connected to the first subpixel circuit and the fifth subpixel circuit, the first electrode in the second subpixel is divided into a 21st electrode and a 22nd electrode, the second subpixel circuit includes a 21st subpixel circuit including the 21st electrode and a 22nd subpixel circuit including the 22nd electrode, the 21st subpixel circuit is connected to the second scanning line, the 22nd subpixel circuit is connected to the first scanning line, and the 21st subpixel circuit and the 22nd subpixel circuit are connected to an identical data line among the plurality of data lines.

13. The display device according to claim 12,
wherein the plurality of data lines further includes a second data line connected to the 21st subpixel circuit and the 22nd subpixel circuit.

14. The display device according to claim 12,
wherein
the first electrode in the fourth subpixel is divided into a 41st electrode and a 42nd electrode, the fourth subpixel circuit includes a 41st subpixel circuit including the 41st electrode and a 42nd subpixel circuit including the 42nd electrode, the 41st subpixel circuit and the 42nd subpixel circuit are connected to an identical data line among the plurality of data lines, the 42nd subpixel circuit is connected to the second scanning line, and the third scanning line adjacent to the second scanning line on a side opposite to the first scanning line.

15. A display device, comprising:
a plurality of subpixels each formed to have a light-emitting layer that is island-shaped,
wherein
each of the plurality of subpixels has a first electrode, the light-emitting layer, a second electrode, and a corresponding one of a plurality of subpixel circuits provided at intersection points of a plurality of data lines and a plurality of scanning lines,
the plurality of subpixels includes
  a first subpixel including a first light-emitting layer, which is island-shaped, and a first subpixel circuit corresponding to the first light-emitting layer,
  a second subpixel including a second light-emitting layer, which is island-shaped, and a second subpixel circuit corresponding to the second light-emitting layer,
  a third subpixel including a third light-emitting layer, which is island-shaped, and a third subpixel circuit corresponding to the third light-emitting layer,
  a fourth subpixel including a fourth light-emitting layer, which is island-shaped, and a fourth subpixel circuit corresponding to the fourth light-emitting layer, and
  a fifth subpixel including a fifth light-emitting layer, which is island-shaped, and a fifth subpixel circuit corresponding to the fifth light-emitting layer, the first light-emitting layer and the second light-emitting layer are adjacent to each other in a column direction, the fourth light-emitting layer and the fifth light-emitting layer are adjacent to each other in the column direction, the first light-emitting layer and the fourth light-emitting layer are adjacent to each other in a row direction, the second light-emitting layer and the fifth light-emitting layer are adjacent to each other in the row direction, the third light-emitting layer is adjacent to the first light-emitting layer, the second light-emitting layer, the fourth light-emitting layer, and the fifth light-emitting layer in a diagonal direction, the plurality of scanning lines includes a first scanning line connected to the fifth subpixel circuit and a second scanning line adjacent to the first scanning line and connected to the first subpixel circuit, the plurality of data lines includes a first data line connected to the first subpixel circuit and the fifth subpixel circuit, each of the plurality of subpixels is further provided with a cover film including an opening exposing the first electrode, the first light-emitting layer emits blue light, and an area of the opening exposing the first electrode in the first subpixel is greater than an area of the opening exposing the first electrode in each of the second subpixel, the third subpixel, and the fourth subpixel.

16. The display device according to claim 15,
wherein the area of the opening exposing the first electrode in the first subpixel is the same as an area of the opening exposing the first electrode in the fifth subpixel.

17. The display device according to claim 15,
wherein
the plurality of data lines includes a second data line and a third data line, the areas of the openings exposing corresponding ones of the first electrodes between subpixels of an identical color among the plurality of subpixels, which are adjacent to each other and connected to the second data line, are identical, and the areas of the openings exposing corresponding ones of the first electrodes between subpixels of an identical color among the plurality of subpixels, which are adjacent to each other and connected to the third data line, are identical.

* * * * *